United States Patent
Curran, Jr. et al.

(10) Patent No.: US 6,340,601 B1
(45) Date of Patent: Jan. 22, 2002

(54) METHOD FOR REWORKING COPPER METALLURGY IN SEMICONDUCTOR DEVICES

(75) Inventors: Thomas F. Curran, Jr., Milton; Timothy C. Krywanczyk, Essex Junction; Michael S. Lube, Richmond; Matthew D. Moon, Jeffersonville; Rock Nadeau, Jericho; Clark D. Reynolds, Colchester; Dean A. Schaffer, Essex Junction; Joel M. Sharrow, South Hero; Paul H. Smith, Jr., Essex Junction; David C. Thomas, Richmond; Eric J. White, Charlotte; Kenneth H. Yao, Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/476,237

(22) Filed: Dec. 30, 1999

Related U.S. Application Data (60) Provisional application No. 60/146,728, filed on Aug. 2, 1999.

(51) Int. Cl.[7] .......................................... H01L 21/4763
(52) U.S. Cl. .......................... 438/4; 438/626; 438/633; 438/645
(58) Field of Search ........................... 438/4, 625, 626, 438/627, 633, 643, 645, 687, 692

(56) References Cited

U.S. PATENT DOCUMENTS

| | | |
|---|---|---|
| 4,415,606 A | 11/1983 | Cynkar et al. |
| 4,789,648 A | 12/1988 | Chow et al. |
| 5,011,580 A | 4/1991 | Pan et al. |
| 5,142,828 A | 9/1992 | Curry, II |
| 5,626,715 A * | 5/1997 | Rostoker |
| 5,656,554 A * | 8/1997 | Desai et al. |
| 6,046,478 A * | 4/2000 | Klein |
| 6,093,649 A * | 7/2000 | Roberts et al. |
| 6,124,201 A * | 9/2000 | Wang et al. |

OTHER PUBLICATIONS

JP Couyras et al., Rework Process Of Cured Polyimide, May 1981, IBM Technical Disclosure Bulletin, vol. 23, No. 12, p. 5334.

Aluminum Metallurgy Rework Process, Sep. 1990, IBM Techincal Disclosure Bulletin, vol. 33, No. 4, p. 240.

Multiple Level Integrated Circuit Rework Using Chemical Mechanical Polish and Reactive Ion Etch, Jun. 1992, IBM Technical Disclosure Bulletin, vol. 35, No. 1B, p. 254–255.

Selective Chemical–Mechanical Polishing Process for Removal of Copper, Feb. 1993, IBM Technical Disclosure Bulletin, vol. 36, No. 02, p. 171.

Rework Process for Integrated Circuit Chip Pads, Jan. 1994, IBM Technical Disclosure Bulletin, vol. 37, No. 01, p. 333.

Rework Procedure for Oxide Shemical Mechanical Polish with Open Via's Present, May 1994, IBM Technical Disclosure Bulletin, vol. No. 05, p. 503–504.

Alkaline Formulations for Chemical Mechanical Polishing of Copper Utilizing Azole Passivation, Oct. 1994, IBM Technical Disclosure Bulletin, vol. 37, No. 10, p. 187.

(List continued on next page.)

Primary Examiner—Charles Bowers
Assistant Examiner—Stephen W. Smoot
(74) Attorney, Agent, or Firm—Howard J. Walter, Jr.

(57) ABSTRACT

A method of reworking copper metallurgy on semiconductor devices which includes selective removal of insulator, selective removal of copper, non-selective removal of copper and insulator followed by the redeposition of an insulating copper barrier layer and at least one metallurgical interconnect layer.

16 Claims, 7 Drawing Sheets

OTHER PUBLICATIONS

Chemical–Mechanical Polishing of Copper with Ammonium Persulfate, Oct. 1994, IBM Technical Disclosure Bulletin, vol. 37, No. 10, p. 655.

CW Kaana, et al., Dual Damascene: A Ulsi Wiring Technology, Jun. 11–12, 1991, VMIC Conference, IEEE Catalog No. 91TH0359–0/91/0000–0144, p. 144–152

B. M. Fritzer and C, P. Knodt, External Rework Process for Multilevel Metal Integrated Circuits, Mar. 1981, IBM Technical Disclosure Bulletin, vol. 23, No. 10, p. 4449–4450

* cited by examiner

METHOD FOR REWORKING COPPER METALLURGY IN SEMICONDUCTOR DEVICES

This application claims priority of United States Provisional Application Serial No. 60/146,728 filed Aug. 2, 1999 of the same title.

BACKGROUND OF THE INVENTION

Field of the Invention

This invention relates to semiconductor manufacturing technology and more particularly to methods of increasing the yield of semiconductor products by recovering and reworking semiconductor devices which when initially processed have defects or faults in interconnect metallurgy causing devices to be unsuitable for use.

Background of the Invention

The manufacture of semiconductor devices includes several hundred processing steps. Although the yield for each process step may be very high, the cumulative yield can be low. Thus, each process step needs to be optimized to obtain productive yield. A common practice, suitable for many process steps, is that of "reworking" or returning processed product to an earlier point in a process to repeat the step or steps which were detected to have not been performed properly.

Not all process steps are subject to being reworked since the changes induced by the particular process must be reversible. That is, the product must be capable of having the effects of the process removed. Photoresist processing is one of the simplest process steps to rework. Another process area where rework has been utilized is in the interconnect metallurgy commonly referred to as Back End Of Line (BEOL) area.

Typically, semiconductor devices have used aluminum-based lines, tungsten studs and silicon dioxide-based insulators which are relatively easy to rework. Two common approaches have been used to rework aluminum-based BEOL. The first method utilizes a plurality of material selective etchants to sequentially remove particular materials. Exposed metal may be etched followed by etching of exposed insulator and so on until the desired starting point is reached. Many semiconductor processing technologies utilize as many as five or six levels of metalization.

The second method of reworking, only recently developed, uses Chemical-Mechanical-Planarization (CMP) to remove entire levels of metal and insulator. Common to both of these techniques is the removal of the entire level of metallurgy comprising metal and it's respective InterLevel Dielectric (ILD) so that the semiconductor wafer may be returned to the process line to have the entire ILD/metal reapplied.

The emergence of copper-based metallurgy as a replacement for aluminum-tungsten-based metallurgy has posed a number of problems in its manufacture, not the least of which is rework of the BEOL process sequence.

SUMMARY OF THE INVENTION

Accordingly, it is an object of this invention to provide a practical rework process for BEOL processing of copper which allows repair at any level of metallurgy.

It is another object to provide reworked semiconductor devices without altering the function or reliability of the finished semiconductor device.

It is yet another object of this invention to provide a method for reworking copper metallurgy which is formed by the inlaid or Damascene process.

It is still another object of this invention to provide a BEOL rework process which can be implemented at any point in the manufacturing process.

These and other objects are achieved by a combination of etch and CMP process steps which provide accurate control of the removal of materials suitable to a copper Damascene technology currently being introduced into manufacturing.

Briefly, the invention includes the steps of etching exposed regions of insulator, CMP removal of the conductor level, CMP removal of any liner material and a substantial portion of any vertical interconnect or via material. These steps are repeated until the lowest level of conductor to be removed is reached. Removal of the ILD and via metal is stopped prior to removing the entire level. Following the removal of the upper regions of the substrate, a barrier layer is applied and then regular BEOL processing steps are carried out by forming a new layer of ILD and conductor.

These and other objects of the invention will be more apparent to those skilled in the art when viewed in conjunction with the accompanying drawings and the preferred embodiment.

DESCRIPTION OF THE PREFERRED EMBODIMENT

The invention is described in terms of a specific embodiment in order to easily demonstrate its application to copper BEOL technology but can be easily adapted to other advanced metallurgical technologies.

Figure 1:
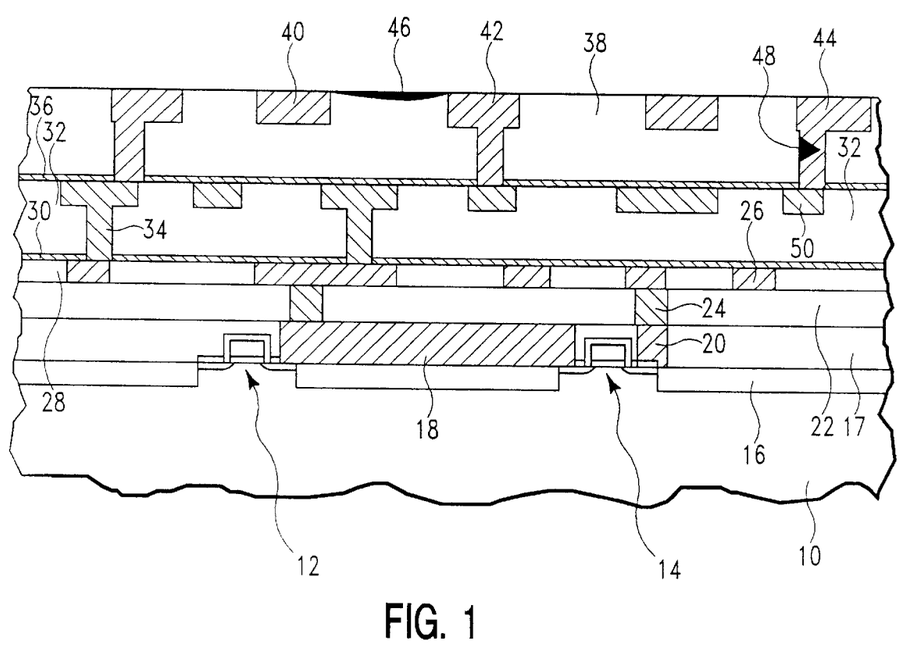
FIG. 1 is a cross sectional view of a partially fabricated semiconductor device which includes defective metallurgy.

Referring now to FIG. 1 there is shown a cross section of a typical semiconductor substrate including Damascene copper conductors embedded in an interlevel dielectric material. Prior to describing the steps specific to the invention, the semiconductor device will be described.

There is provided a semiconductor substrate 10 with previously formed field effect transistors 12 and 14 separated by Shallow Trench Isolation (STI) 16. Over the transistors there is formed a first ILD of a nitride/phosphorus doped oxide layer 18. A local interconnect 17 and contact via stud 20 are formed of CVD deposited tungsten. Next a second layer 22 of ILD is formed. Through layer 22 are another level of tungsten contact vias 24. Next, the first layer of single Damascene copper 26 and its required liner is formed, preferably by deposition and planarization by CMP in a third layer of ILD 28. Copper layer 26 is protected by a silicon nitride barrier layer 30 to prevent the diffusion of copper into the ILD.

Continuing the process, there is another level of metallurgy comprising yet another layer of ILD 32 and a layer of dual-Damascene copper 34 and passivating layer 36 of silicon nitride. Dual-Damascene refers to the use of both line and via patterns being formed in the interlevel dielectric to form both interconnect line and via simultaneously from a single deposition of conductor (copper). For additional description of dual-Damascene see the article "DUAL DAMASCENE: A ULSI WIRING TECHNOLOGY," by C. W. Kaanta et al., 1991 Proceedings IEEE VLSI Multilevel Interconnection Conference, Jun. 11–12, 1991, pp. 144–152 and U.S. Pat. No. 4,789,648 to Chow et al., issued Dec. 6, 1988.

Finally, a last layer of dual-Damascene copper is formed in ILD 38 to form separate regions 40, 42, 44 of copper.

In addition to the intended interconnects, two defects 46 and 48 are illustrated in FIG. 1. Defect 46 represents the filling of a scratch or depression in the surface of substrate 10 as a result of incomplete CMP processing. The result is the unintended shorting of copper segments 40 and 42.

The second defect 48 represents a void or partially filled via which can increase the resistivity of the interconnect between copper segments 44 and copper segment 50.

It should be understood that any number of reasons might dictate the necessity to rework a semiconductor device. Defects such as were previously described may occur in any level of the copper. Other types of defects, including mask errors causing circuits to malfunction may also be subject to being reworked.

Once defects are detected and it is determined that a semiconductor wafer can be recovered by a rework process, the process of the invention can be applied, The first step in the rework process is to selectively remove, preferable by etching, the dielectric of ILD layer 38.

Reworking of copper-based metallurgy using dry etch chemistry for etching copper is extremely difficult due to the lack of volatile compounds as byproducts at normal etching temperatures. In addition, the simple removal of the ILD in the presence of copper becomes difficult due to the tendency of copper to sputter off of lines and redeposit on the ILD rendering the etching of the ILD difficult. Therefore, a low powered RIE process is needed to selectively remove the ILD.

Figure 2A:
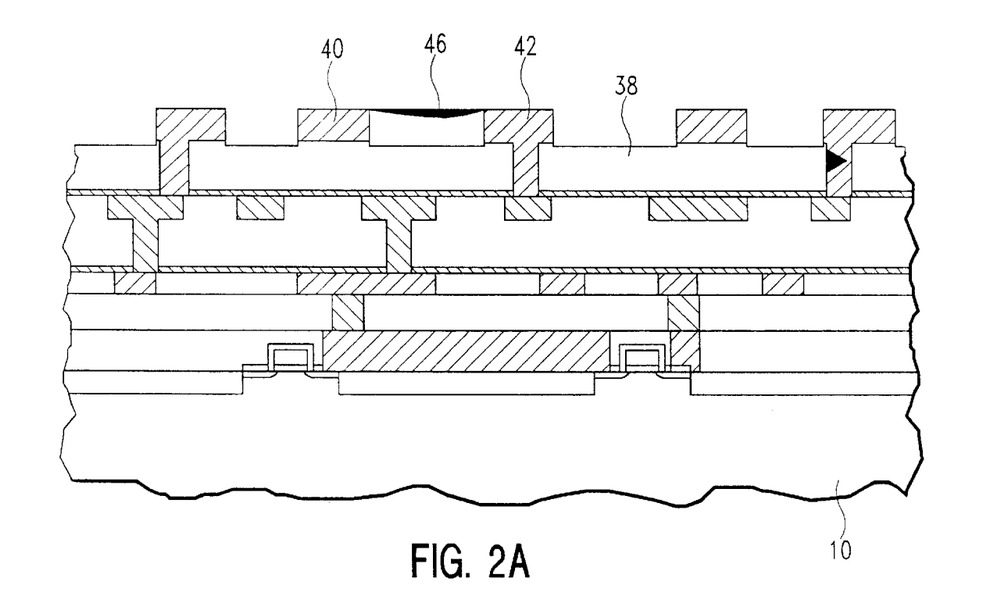
FIGS. 2A and 2B are cross sectional views of the device of FIG. 1 following an anisotropic and an isotropic etching processing process step, respectively.

FIG. 2A shows the effect of using an anisotropic dry etch such as Reaction Ion Etch (RIE). While previous attempts to use dry etching for removal of copper have resulted in the resputtering of copper over the oxide forming a non-etchable micromask which prevents the oxide from etching effectively. The preferred technique allows effective dry etching and eliminates non-uniformity from the rework process. The process also produces free standing copper structures as were originally produced in oxide without undercutting as shown in FIG. 2A, Such a process also allows the use of low-k dielectrics which would not withstand the processing of the copper due to physical weakness of the dielectric. In this manner a stack of low-k material can be built by using a conventional silicon nitride/oxide stack with copper processing and CMP, removing the oxide, applying low-k material, and repeating.

The inventors have found that the use of a hydrogen plasma at temperatures in the 300–400° C. range allows interlevel dielectric oxide to etched selectively from around copper structures without sputtering copper as seen with other etch chemistries. This process is highly selective to no-oxide materials. Etching may also be achieved by a plasma comprising Argon CF4, CHF3 and oxygen.

Figure 2B:
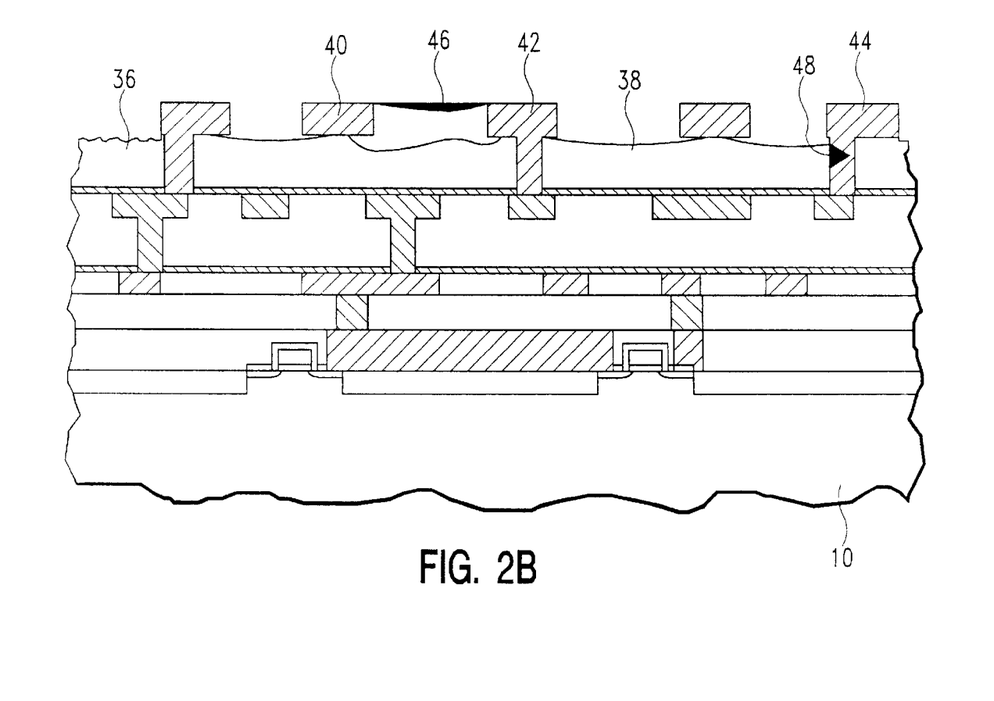

FIG. 2B illustrates the etching step as effected by a wet etch comprising dilute hydrofluoric acid.

The purpose of selectively etching the ILD is to expose a large portion of the copper interconnect regions 40, 42 and 44 in order to render the copper easier to remove.

Figure 3:
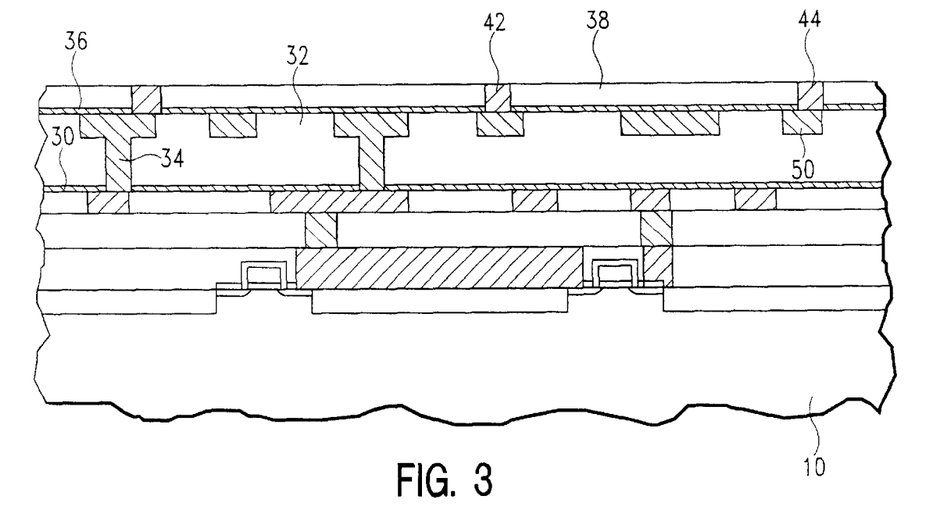
FIG. 3 is a cross sectional view of the device of the invention following the removal of the metallurgy by CMP processing.

Next, the exposed copper is CMP polished off of the substrate using the similar polishing parameters and slurry as used to polish the copper in the process used to fabricate the initial metallurgy of the device. After the removal of the bulk of the copper layer, a second CMP polish step using the same slurry as that for removing the copper liner material is used to simultaneously polish the via portions of the copper regions as well as the ILD 38. CMP continues until most, but not all of the ILD and vias are removed to leave the conductor via/insulator substantially coplanar. The purpose in not removing the entire layer of ILD is to not disturb the upper surface of the underlying copper lines protected by the silicon nitride layer 36.

At this point the two defects 46 and 48 will have been removed. Should these be the only defects present in the device, reconstruction can occur by depositing an insulating barrier layer to copper diffusion, such as silicon nitride, followed by an ILD and desired metallurgy such as single- or dual-Damascene copper completing the reworked level of interconnect metallurgy. Because topography may be introduced to the surface of the device, planarization of the device may be used.

In this example, however, it has been assumed that other defects in lower levels continue to exist requiring that at least one additional layer of interconnect to be removed. This requires that the previously executed steps be repeated as many times as necessary to remove all of the defective levels. The only exception being that when more than one level of metallurgy is to be removed only the lowest level is partially removed.

Figure 4:
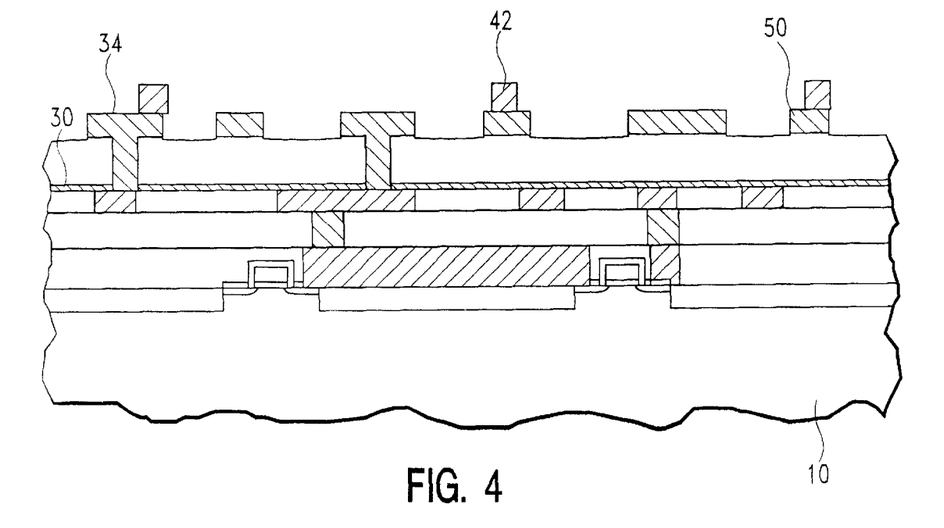
FIG. 4 is a cross sectional view of the device of the invention following a second etching step.

Next, the substrate of FIG. 3 is subjected to a selective etchant, preferably an RIE plasma etch which removes the remaining oxide ILD 38, nitride layer 36 and ILD 32 to again expose the remaining regions of copper regions, including regions 34, 42 and 50, as shown in FIG. 4.

Figure 5:
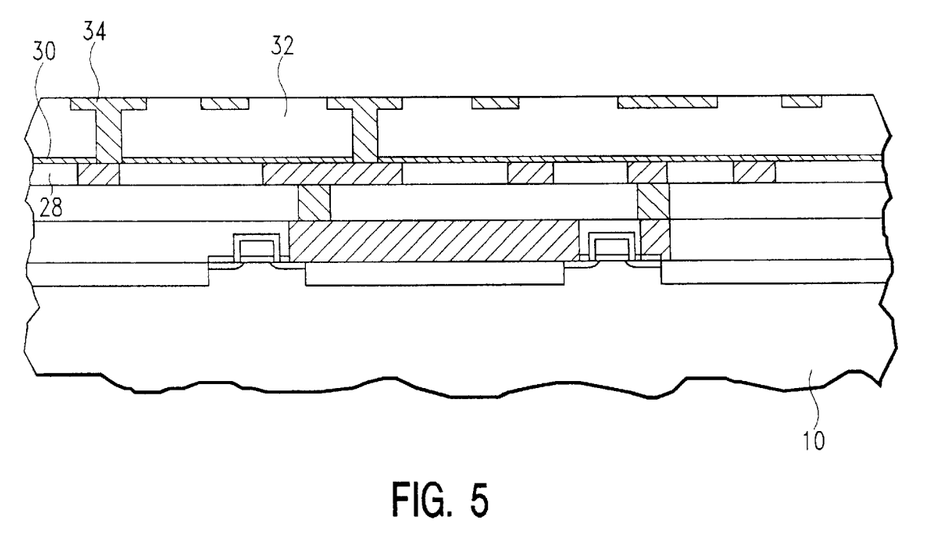
FIG. 5 is a cross sectional view of the device of the invention following the removal by CMP of the second metal layer.

Next, the copper and liner CMP processes are carried out again to remove substantially all of the remaining copper resulting in the structure shown in FIG. 5.

Figure 6A:
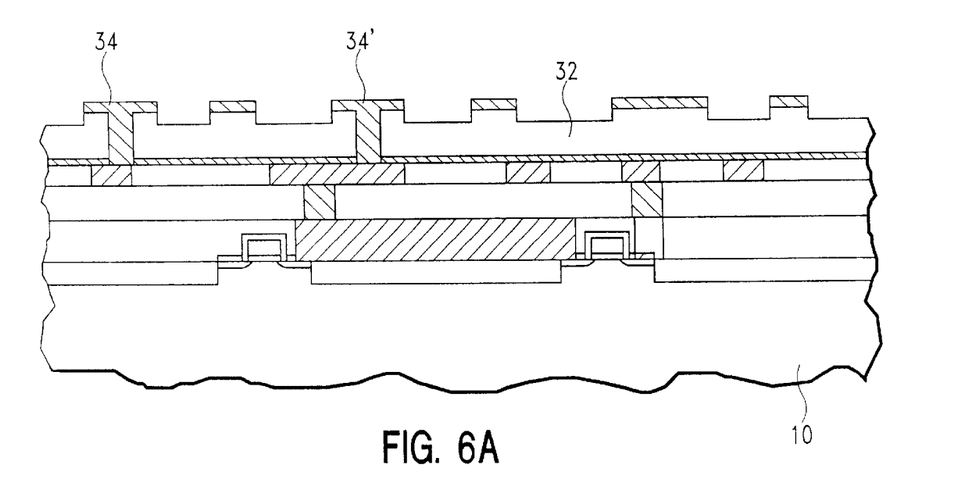
FIGS. 6A and 6B are cross sectional views of the device of the invention following a second anisotropic and isotropic etching step.
Figure 6B:
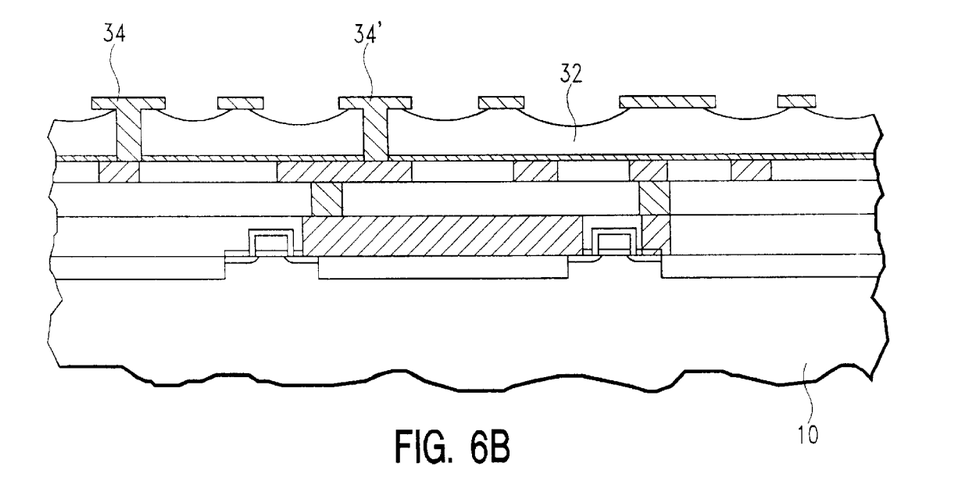
Figure 7:
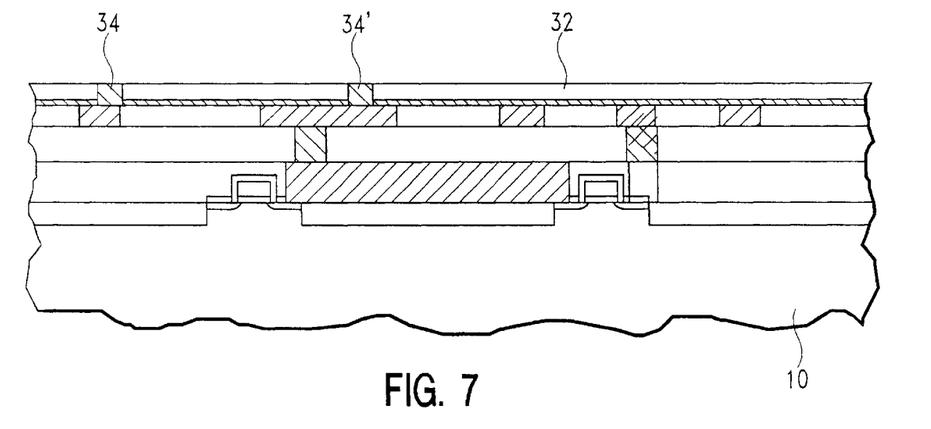
FIG. 7 is a cross sectional view of the device of the invention following a second copper CMP removal step.

Following the removal of the copper, the next ILD 32 is selectively etched, once again as was done previously using wet or dry etchants resulting in the structure shown in FIGS. 6A and 6B resulting in a structure having only copper vias 34 and 34' in ILD 32. As in the previous steps, a portion of the studs 34 and 34' are left, as shown in FIG. 7.

At this point in the process all of the defects have been removed and the semiconductor device is ready to have the interconnection metallurgy reapplied.

Figure 8:
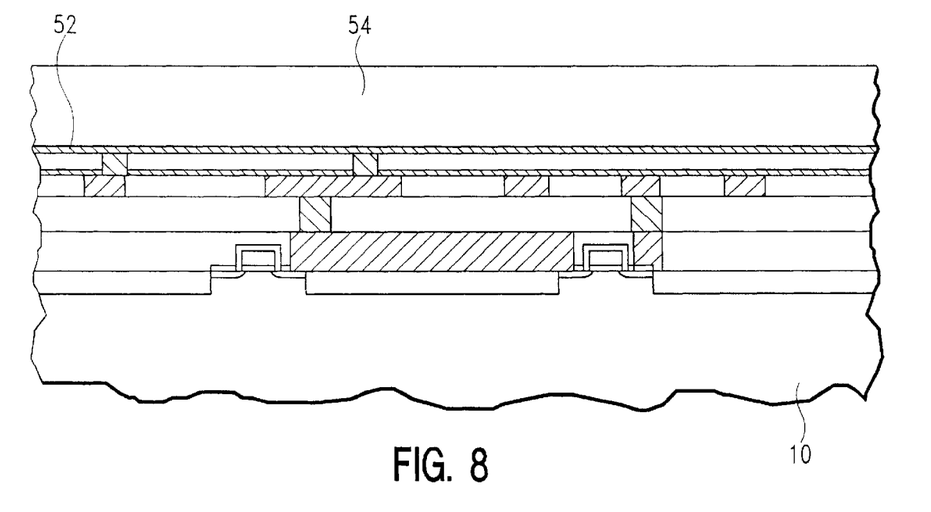
FIG. 8 is a cross sectional view of the device of the invention following the reformation of a barrier layer and a new ILD layer.

Referring to FIG. 8 there is next applied an insulating copper barrier layer 52, such as silicon nitride followed by a thick layer 54 of ILD. The barrier layer is applied over the coplanar conductive-insulator.

Figure 9:
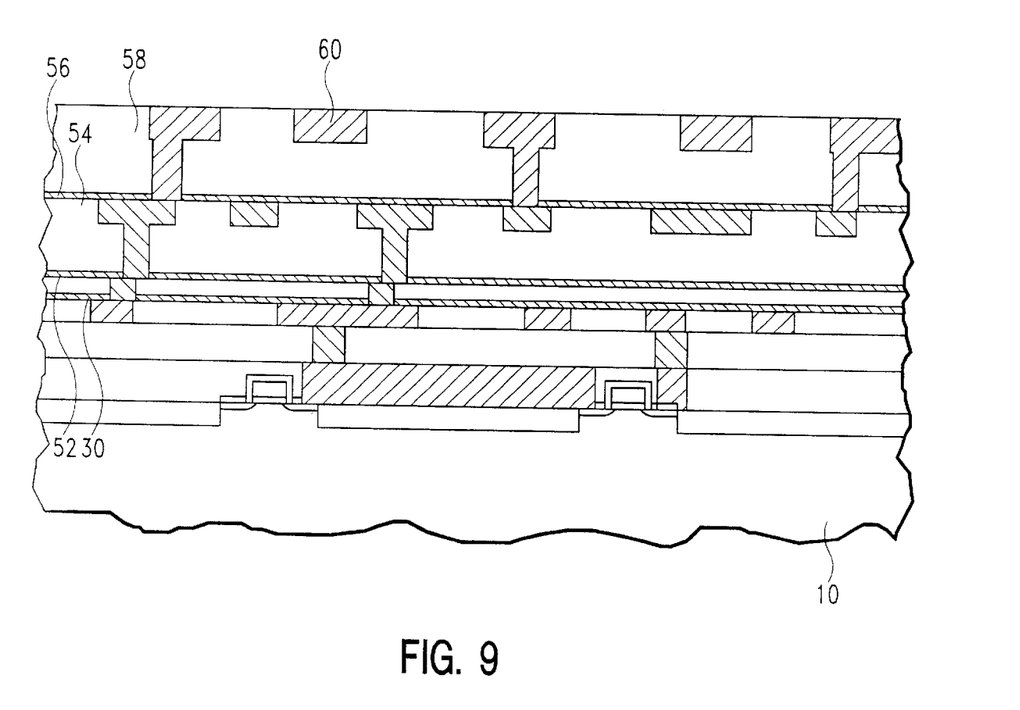
FIG. 9 is a cross sectional view of the device of the invention at the completion of the rework process.

The last step in the rework process, as shown in FIG. 9, is the formation of the last dual-Damascene copper interconnect regions 60. These conductors are aligned with the conductors in the coplanarized layer in order to make proper contact to the underlying circuitry. In some instances, in the case of errors in the wiring levels, not all conductors in the lower level need to be contacted by corresponding conductors in the reworked level.

As shown in FIG. 9, the various layers as previously present in the un-reworked device as shown in FIG. 1 are replaced with corresponding new layers being equivalent as follows: layer 30 is replaced by layer 52, layer 32 by 54, layer 36 by 56, and layer 38 by 58. Thus, the substrate has been reworked to provide the circuitry as originally intended without the defects 46 and 48 of FIG. 1. It will be understood by those skilled in the art that other wiring patterns can be used in the replacement layers.

Those skilled in the art will recognize that various substitutions can be made in practising the invention, such as substitution of materials and processing chemistry to effect the inventive rework process.

Those skilled in the art will also recognize that although the invention has been described in terms of a single embodiment other forms of the invention may be implemented without departing from the spirit and scope of the appended claims

We claim:

1. A method of reworking dual damascene metallurgical interconnects of a semiconductor substrate comprising the steps of:

providing a semiconductor substrate having at least one level of dual damascene interconnection metallurgy comprising a first conductor imbedded in an interlevel dielectric material;

selectively removing at least some of the thickness of said interlevel dielectric to expose at least some of said first conductor;

planarizing any free standing exposed first conductor to remove a substantial portion of said first conductor and retaining a portion of said first conductor;

co-planarizing said first conductor and said interlevel dielectric simultaneously to form a substantially coplanar conductor/insulator surface; and forming a layer of interconnect metallurgy contacting said first conductor comprising an interlevel dielectric and a second conductor.

2. The method of claim 1 wherein the step of selectively removing at least some of said interlevel dielectric is by etching.

3. The method of claim 2 wherein the method of etching is by wet etching.

4. The method of claim 2 wherein the method of etching is by dry etching.

5. The method of claim 4 wherein the dry etching is performed in a hydrogen plasma.

6. The method of claim 5 wherein the dry etching is performed at a temperature between about 300° and 400° C.

7. The method of claim 1 wherein the interlevel dielectric comprises a silicon oxide.

8. The method of claim 1 wherein the interlevel dielectric comprises a low-k insulator.

9. The method of claim 1 wherein said first conductor comprises a copper-based layer.

10. The method of claim 1 wherein said first conductor comprises a barrier metal layer.

11. The method of claim 1 wherein the step of forming said layer of interconnect includes a step of forming a layer of barrier material.

12. The method of claim 11 wherein said formed barrier layer comprises a silicon nitride.

13. The method of claim 1 wherein the step of planarizing said exposed first conductor includes the step of chemical-mechanical planarization.

14. The method of claim 1 wherein the step of co-planarizing said first conductor and said interlevel dielectric comprises the step of chemical-mechanical planarization.

15. The method of claim 1 wherein the steps of removing, planarizing and co-planarizing are repeated at least twice.

16. The method of claim 15 wherein the step of forming said layer of interconnect metallurgy is performed at least twice following the steps of claim 15.

* * * * *